US010097186B1

(12) United States Patent
Epstein et al.

(10) Patent No.: US 10,097,186 B1
(45) Date of Patent: Oct. 9, 2018

(54) ROBUST TUNABLE COUPLING BETWEEN SUPERCONDUCTIVE CIRCUITS

(71) Applicants: Ryan J. Epstein, Denver, CO (US); David James Clarke, Silver Spring, MD (US); Alexander Marakov, Columbia, MD (US); Gregory R. Boyd, Washington, DC (US); Anthony Joseph Przybysz, Linthicum, MD (US); Joel D. Strand, Ellicott City, MD (US); David George Ferguson, Takoma Park, MD (US)

(72) Inventors: Ryan J. Epstein, Denver, CO (US); David James Clarke, Silver Spring, MD (US); Alexander Marakov, Columbia, MD (US); Gregory R. Boyd, Washington, DC (US); Anthony Joseph Przybysz, Linthicum, MD (US); Joel D. Strand, Ellicott City, MD (US); David George Ferguson, Takoma Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/910,254

(22) Filed: Mar. 2, 2018

(51) Int. Cl.
*H03K 19/195* (2006.01)
*G06N 99/00* (2010.01)
*H03K 3/38* (2006.01)
*H03K 19/16* (2006.01)

(52) U.S. Cl.
CPC ....... *H03K 19/1958* (2013.01); *G06N 99/002* (2013.01); *H03K 3/38* (2013.01); *H03K 19/16* (2013.01)

(58) Field of Classification Search
CPC ...... H03K 19/1958; H03K 3/38; H03K 19/16; G06N 99/002
USPC .............................................. 326/4
See application file for complete search history.

(56) References Cited

U.S. PATENT DOCUMENTS

| 8,508,280 B2 * | 8/2013 | Naaman | H03K 3/38 326/3 |
| 9,647,662 B1 * | 5/2017 | Abutaleb | H03K 19/017545 |
| 9,966,926 B2 * | 5/2018 | Abdo | H03H 7/0138 |

(Continued)

OTHER PUBLICATIONS

Harris, et al.: "Sign- and Magnitude-Tunable Coupler for Superconducting Flux Qubits" Phys. Rev. Lett. 98, 177001 (2007).

(Continued)

*Primary Examiner* — Dylan White
(74) *Attorney, Agent, or Firm* — Tarolli, Sundheim, Covell & Tummino LLP (57) ABSTRACT

Systems and methods are provided for linking two components in a superconducting circuit. A plurality of circuit elements, each comprising one of an inductor, a capacitor, and a Josephson junction, are connected in series on a path connecting the two components. A plurality of tunable oscillators are connected from the path connecting the two components. Each tunable oscillator is responsive to a control signal to tune an associated resonance frequency of the tunable oscillator within a first frequency range, within which the two components are coupled, and within a second frequency range, within which the two components are isolated.

20 Claims, 4 Drawing Sheets

(56) References Cited

U.S. PATENT DOCUMENTS

| | | | |
|---|---|---|---|
| 2009/0322374 A1* | 12/2009 | Przybysz | B82Y 10/00 326/5 |
| 2011/0018612 A1* | 1/2011 | Harris | B82Y 10/00 327/528 |
| 2015/0349780 A1* | 12/2015 | Naaman | H03K 19/1958 326/5 |
| 2017/0212860 A1* | 7/2017 | Naaman | G06F 13/4027 |
| 2018/0145631 A1* | 5/2018 | Berkley | H03B 15/003 |

OTHER PUBLICATIONS

Harris, et al.2: "Compound Josephson-Junction Coupler for Flux Qubits with Minimal Crosstalk" Phys. Rev. B 80, 052506 (2009).
Pinto, et al. "Analysis of a Tunable Coupler for Superconducting Phase Qubits" Phys. Rev. B 82, 104522 (2010).
Allman, et al. "RF-SQUID Mediated Coherent Tunable Coupling Between a Superconducting Phase Qubit and a Lumped Element Resonator" Phys. Rev. Lett. 104, 177004 (2010).
Bialczak, et al. "Fast Tunable Coupler for Superconducting Qubits" Phys. Rev. Lett. 106, 060501 (2011).
Pierre, et al. "Storage and On-Demand Release of Microwaves Using Superconducting Resonators with Tunable Coupling" Appl. Phys. Lett. 104, 232604 (2014).
Chen, et al. "Qubit Architecture with High Coherence and Fast Tunable Coupling" Phys. Rev. Lett. 113, 220502 (2014).
Geller, et al. "Tunable Coupler for Superconducting Xmon Qubits" Phys. Rev. A 92, 012320 (2015).
Kafri, et al. "Tunable Inductive Coupling of Superconducting Qubits in the Strongly Nonlinear Regime" Submitted for publication, arXiv:1606.08382 (2016).
Weber, et al. "Coherent Coupled Qubits for Quantum Annealing" Submitted for publication, arXiv: 1701.06544 (2017).

* cited by examiner

ROBUST TUNABLE COUPLING BETWEEN SUPERCONDUCTIVE CIRCUITS

This invention was made with Government support under Contract No. 30078128. The Government has certain rights in this invention.

TECHNICAL FIELD

The present invention relates generally to superconducting circuits, and more particularly to robust tunable coupling between superconducting circuits.

BACKGROUND

The fundamental challenge for quantum computation and simulation is to construct a large-scale system of highly connected coherent qubits to perform various operations. Superconducting qubits utilize macroscopic circuits to process quantum information and are a promising candidate towards this end. Recently, materials research and circuit optimization has led to significant progress in qubit coherence. Superconducting qubits can now perform hundreds of operations within their coherence times, allowing for research into complex algorithms such as error correction. In many applications, it is desirable to combine these high-coherence qubits with tunable inter-qubit coupling, since it would allow for both coherent local operations and dynamically varying qubit interactions. For quantum computation, this would provide isolation for single-qubit gates while at the same time enabling fast two-qubit gates that minimize errors from decoherence. Despite previous attempts at tunable coupling, these applications have yet to be realized due to the challenge of incorporating tunable, long-distance coupling with high coherence devices.

SUMMARY

In one example, a tunable coupler assembly is provided for linking two components in a superconducting circuit. A plurality of circuit elements, each comprising one of an inductor, a capacitor, and a Josephson junction, are connected in series on a path connecting the two components. A plurality of tunable oscillators are connected from the path connecting the two components. Each tunable oscillator is responsive to a control signal to tune an associated resonance frequency of the tunable oscillator within a first frequency range, within which the two components are coupled, and within a second frequency range, within which the two components are isolated.

In another example, a method is provided for providing a tunable coupling between two components in a superconducting circuit. A first circuit path is fabricated between the two components. The first circuit path includes a plurality of circuit elements, each of which is an inductor, a capacitor, or a Josephson junction. A plurality of tunable oscillators are connected from respective points along the first circuit path. Each tunable oscillator is responsive to a control signal to tune an associated frequency of the oscillator.

In yet a further example, a tunable coupler assembly is provided for linking two components in a superconducting circuit. A plurality of circuit elements are connected in series on a path connecting the two components. Each of the plurality of circuit elements are an inductor, a capacitor, or a Josephson junction. A plurality of compound Josephson junctions are connected from the path connecting the two components to ground. Each tunable oscillator is responsive to a control flux provided by a common bias line to tune an associated resonant frequency of the tunable oscillator within a first frequency range, within which the two components are coupled, and within a second frequency range, within which the two components are isolated.

DETAILED DESCRIPTION

The present disclosure relates generally to coupling superconducting circuits, and more particularly to proving tunable coupling between components that is robust against fabrication error and errors in a provided control flux. A tunable coupling component is placed between two components in a superconducting circuit. The tunable coupling component can be adjusted to provide a strongly coupled state or a decoupled (or isolation) state between the components. In one example, manipulation can be performed on state information of an isolated qubits in the decoupled state, while the state information can be passed to other components of the superconducting circuit during a strongly coupled state.

Couplers of prior art have a linear dependence on control flux at the off point, that is, at the value of a control parameter that is intended to isolate the coupled components. This makes the off state of the coupler very sensitive to control flux and any changes in the off point, and the off point can change when the impedance of the circuits being coupled changes, such as when a second coupler coupled to one of the same circuits changes its coupling value. The inventive coupler is comprised of a chain of inductively coupled tunable LC resonators, whose lowest frequency collective mode can be tuned via bias flux over a wide range, such as 5-40 GHz. When the lowest frequency coupler mode is at its highest frequency, the coupler is turned off, isolating the components linked by the tunable coupler. At an appropriate value for the control signal, the coupler mode frequencies decrease and the lowest mode approaches frequencies of the components linked by the tunable coupler, providing strong coupling between the two components. In other words, rather than an off point, the inventive coupler provides substantial isolation for a range of control flux values. In one example, when no control signal is applied to the tunable oscillator, the coupler remains in the "off" state. This state persists for small values of the control signal, and is thus insensitive to variations in the control flux. The residual coupling provided in the off state decreases approximately exponentially as the number of tunable oscillator "legs" in the coupler is increased.

In one example, a chain of coupled compound Josephson junction resonators is used as the coupling component. Near zero control flux, the effective inductances of the compound Josephson junctions are small and cause currents travelling along the backbone of the coupler to decay approximately exponentially. This shuts off the coupler for DC currents. When the control flux is near half a flux quantum in each compound Josephson junction loop, the effective inductances of each compound Josephson junction is large, and the current along the backbone decays more slowly, allowing coupling. For AC operation, the compound Josephson junctions act as tunable LC resonators that are much higher in frequency in the "off" state than the modes of the quantum circuits to be coupled. The off coupling decreases approximately exponentially in the number of compound Josephson junction resonator stages. One advantage of using detuning of the mode frequencies to turn off the coupling is that there is a threshold behavior where the coupler is off if the detuning is sufficiently large. This is favorable compared to the typical case where the off state is at a specific control flux value.

Figure 1:
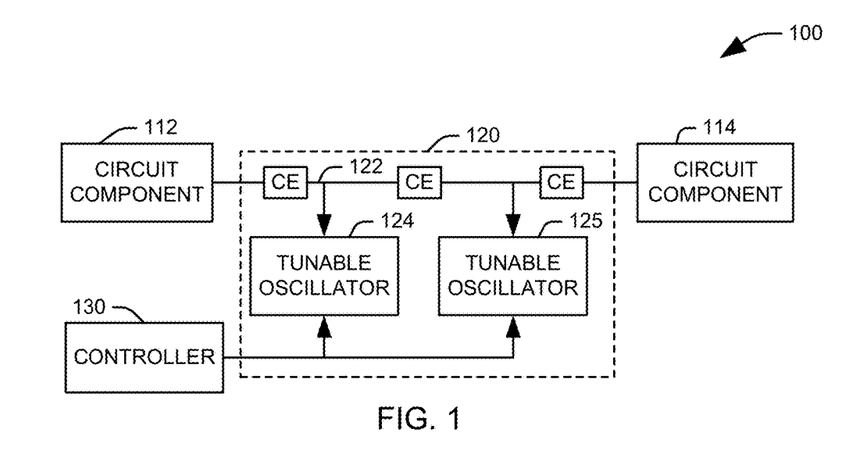
FIG. 1 illustrates a block diagram of an example of a superconducting system.

FIG. 1 illustrates a block diagram of an example of a superconducting system 100. The superconducting system includes a first circuit component 112 coupled to a second circuit component 114 through a tunable coupler 120. It will be appreciated that each of the first and second circuit components 112 and 114 can represent a qubit, a resonator, such as a lumped-element LC oscillator or a distributed resonator, a dissipative sub-circuit (e.g., a circuit containing resistive elements), or any other appropriate component for a superconducting system. It will also be appreciated that the term qubit is a shorthand for any system that contains two or more quantum states that can store quantum information. Exemplary implementations of superconducting qubits include the transmon, flux qubit, quantronium, the cooper pair box, and fluxonium, and typically include one or more of a Josephson junction, capacitor and inductor. It will be further appreciated that the term "coupled" is intended to encompass any means by which two systems can exchange energy or information.

The tunable coupler 120 includes a circuit path 122 between the first and second components 112 and 114 having a plurality of inductive and/or capacitive circuit elements (CEs). A given circuit element for the circuit path 122 can be inductors, capacitors, Josephson junctions, or a combination of these elements. A plurality of tunable oscillators 124 and 125 are connected along the circuit path 122. The tunable oscillators 124 and 125 can be any sub-circuit having a resonant frequency that changes with a provided control signal. For example, the tunable oscillators 124 and 125 can be implemented as a compound Josephson junction. Each tunable oscillator 124 and 125 is responsive to a control signal, provided by an associated controller 130 to tune an associated resonant frequency of the oscillator. For example, the control signal can be a control flux provided to the tunable oscillator 124. In one implementation, each of the plurality of tunable oscillators 124 and 125 connect points on the circuit path 122 to ground.

In one example, the tunable coupler 120 is configured such that the two circuit components 112 and 114 are isolated in the absence of a control signal. To couple the two components 112 and 114, the control signal is provided to the tunable oscillators 124 and 125 within a relatively narrow range of values determined by the configuration of the oscillator to tune a frequency of a coupling mode of the tunable coupler close to a frequency associated with one or both of the circuit components 112 and 114. In one example, utilizing a control flux, the range of values is centered at or near one-half of the magnetic flux quantum, $\Phi_0$, and can range between 0.45 $\Phi_0$ and 0.55 $\Phi_0$. As a result, when the control flux is not in this narrow range, the tunable coupler 120 has a robust off-state, and can maintain substantial isolation between the two circuit components across a broad range of values for the control signal. Further, the off-state is very robust to variations in fabrication parameters.

Figure 2:
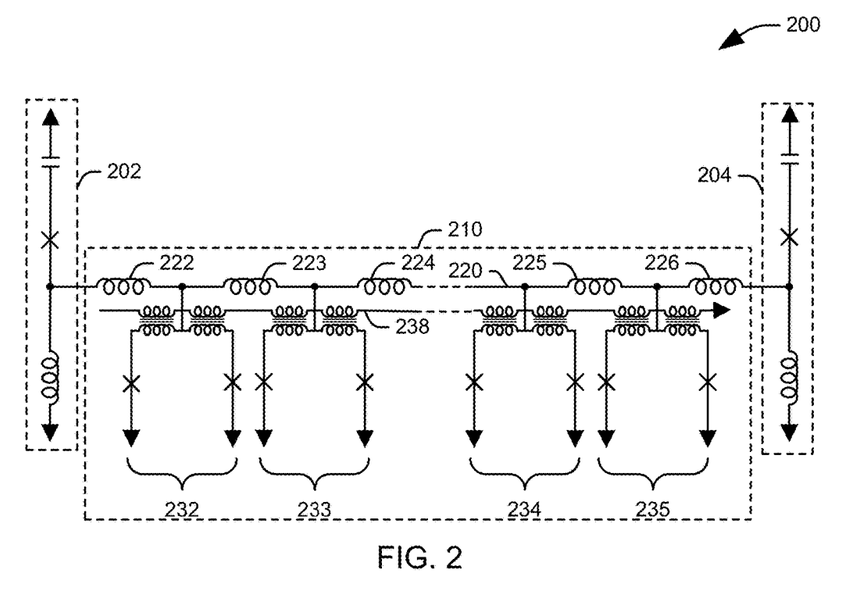
FIG. 2 illustrates one example of a superconducting system comprising two transmon qubits and a tunable coupler.

FIG. 2 illustrates one example of a superconducting system 200 comprising two transmon qubits 202 and 204 and a tunable coupler 210. The tunable coupler 210 includes a circuit path 220, comprising a plurality of circuit elements 222-226, and a plurality of tunable resonators 232-235 connected from the circuit path 220. In the illustrated example, the circuit elements 222-226 are inductors, although it will be appreciated that a given circuit element can be an inductor, a capacitor, or a Josephson junction. In the illustrated implementation, the plurality of tunable resonators 232-235 connect the circuit path 220 to ground, although it will be appreciated that the tunable coupler 210 can be implemented in a floating implementation, with the tunable resonators connected to a second circuit path (not shown) comprising, for example, a second plurality of inductors and/or capacitors. In the illustrated implementation, each of the plurality of resonators 232-235 is implemented as a compound Josephson junction comprising two paths to ground, each interrupted by a Josephson junction. The plurality of tunable resonators 232-235 are tunable via a common bias line 238 to provide a control flux to the circuit loops containing the compound Josephson junctions.

It will be appreciated that each of the transmon qubits 202 and 204 has at least one characteristic frequency, representing spacing between two energy levels of each transmon qubit. In one implementation, a characteristic frequency of each of the transmon qubits 202 and 204, representing a spacing between the ground and first excited states, can be around 10 GHz, although it will be appreciated that the spacing can vary with the implementation of the qubits. A frequency associated with one or more coupling modes of the tunable coupler 210 is a function of the control flux provided to the plurality of compound Josephson junctions 232-235. In accordance with an aspect of the present invention, when no control flux is provided to the plurality of compound Josephson junctions 232-235, a lowest frequency coupling mode of the tunable coupler 210 remains at a frequency far from the characteristic frequencies of the transmon qubits 202 and 204 and the transmon qubits remain substantially isolated. The specific values of the coupler mode frequency vary with parameters of the coupler components, particularly the critical currents of the Josephson junctions in the compound Josephson junctions 232-235, however, in practice, they are selected to maintain a broad range of values for the control flux for which substantial isolation of the two qubits can be maintained.

The coupler 210 has a relatively narrow range of values for the control flux for which the coupler is active and the transmon qubits 202 and 204 are strongly coupled. In general, the coupler 210 provides a maximum coupling strength when the provided control flux is around 0.5 $\Phi_0$. The behavior of the tunable coupler 210 can be analogized to that of a repeated current divider. When the compound Josephson junctions 232-235 are provided with a control flux outside of the predetermined range, an inductance of the compound Josephson remains low relative to an inductance of the circuit path 220. Accordingly, each of the compound Josephson junctions 232-235 provide an alternate, low-impedance path to ground, restricting current flow between the two transmon qubits 202 and 204. In practice, this isolation is improved (i.e., the residual coupling between the two transmon qubits is reduced) as the number of connected compound Josephson junctions is increased, providing more of these alternative paths to ground. When the compound Josephson junctions 232-235 are provided with control flux within the relatively narrow range of "on" values, the inductance of each compound Josephson junction increases, and becomes high relative to the inductance of the circuit path 220. As a result, the two transmon qubits 202 and 204 become coupled along the circuit path 220.

An approximate variance of the coupling strength of the tunable coupler 210 with the control flux can be described as:

$$g \approx \frac{1}{2L} \frac{y - y^{-1}}{y^N - y^{-N}} \qquad \text{Eq. 1}$$

where $$y = x + \sqrt{x^2 - 1}, \quad x = 1 + \frac{LI_c(\alpha)\pi}{2\Phi_0},$$

L is the size of the inductances 222-226 along the circuit path 220, $I_c$ is a critical current of each compound Josephson junction, which is a function of the control flux, $\alpha$, and N is a number of compound Josephson junctions in the tunable coupler 210.

As can be seen from Eq. 1, when the current through the compound Josephson junctions is high, the coupling drops exponentially with the number of compound Josephson junction, N, in the coupler. When the current through the compound Josephson junctions is low, y approaches 1, and the coupling becomes polynomially small with the number of compound Josephson junctions, allowing for meaningful coupling between the two transmon qubits.

Figure 3:
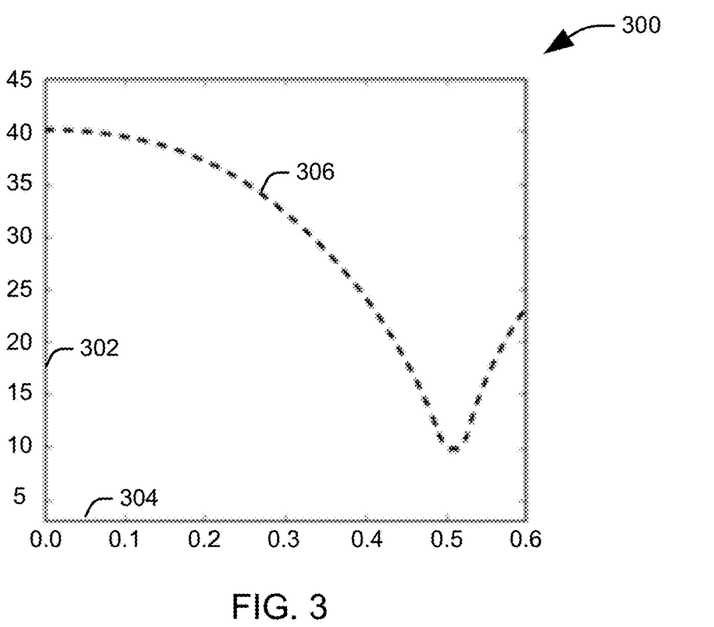
FIG. 3 illustrates a chart showing a lowest frequency coupler mode for the tunable coupler, represented in gigahertz on a vertical axis, as a function of an applied flux, represented in fractions of the magnetic flux quantum on a horizontal axis for one implementation of the tunable coupler of FIG. 2.

In one implementation, using Josephson junctions with relatively low critical currents, the coupler 210 includes six compound Josephson junctions. In this implementation, the critical current of the junctions in the two transmon qubits 202 and 204 is 80 nA, the inductance of the inductors in the two transmon qubits is 300 pH, the critical current of the junctions in the plurality of compound Josephson junctions 232-235 is 2000 nA, and the inductance of the inductors 222-226 in the circuit path is 200 pH. FIG. 3 illustrates, for this implementation, a chart 300 showing a lowest frequency coupler mode for the tunable coupler, represented in gigahertz on a vertical axis 302, as a function of an applied flux, represented in fractions of the magnetic flux quantum on a horizontal axis 304.

As can be seen from the plotted line 306, the coupler mode frequency stays well above the 10 GHz characteristic frequency of the two transmon qubits 202 and 204 for a broad range of values. When the coupler mode is at the 40 GHz maximum, the coupling between the two components is minimal, at approximately 0.04 MHz, and it remains below 0.1 MHz for a range of 150 m$\Phi_0$. At this point, the coupler frequency exhibits a slope of $1.1 \times 10^{-6}$ MHz/m$\Phi_0$, such that the variance of the frequency with the control flux has a minimal effect on the coupling. When the control flux approaches 0.5 $\Phi_0$, the frequency of the coupler mode approaches the 10 GHz characteristic frequency of the qubits 202 and 204. At a value around 0.49 $\Phi_0$, the coupler 210 provides a coupling of around 100 MHz, with a slope of around 8.4 MHz/m $\Phi_0$. While couplings well above 100 MHz can be achieved for this implementation, in practice, the applied flux may be kept below 0.49 $\Phi_0$ so that the coupler mode remains more than 1 GHz away from the qubit modes.

Figure 4:
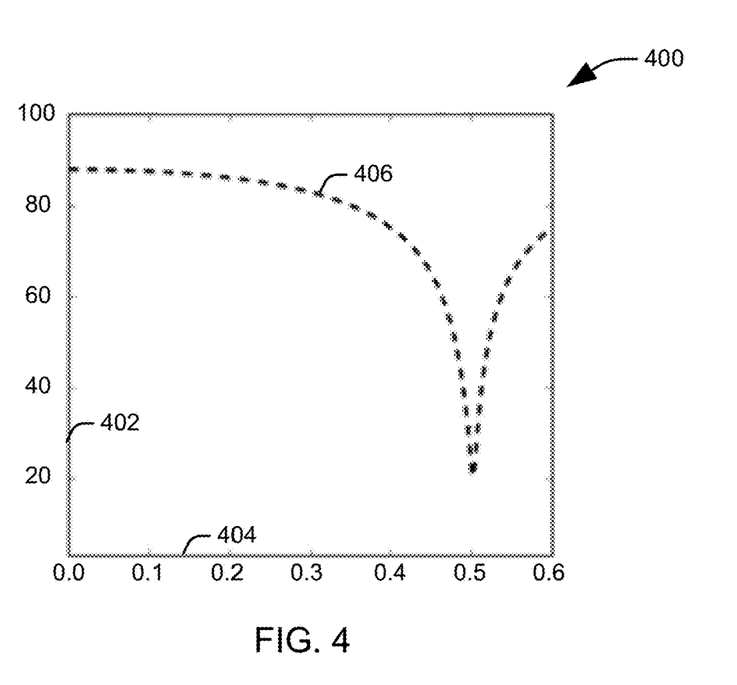
FIG. 4 illustrates a chart showing a lowest frequency coupler mode for the tunable coupler, represented in gigahertz on a vertical axis, as a function of an applied flux, represented in fractions of the magnetic flux quantum on a horizontal axis for another implementation of the tunable coupler of FIG. 2.

For contrast, the behavior of an implementation of a similar coupler, also with six compound Josephson junctions, but using Josephson junctions with relatively high critical currents is illustrated as a chart 400 in FIG. 4. In this implementation, the critical current of the junctions in the two transmon qubits 202 and 204 is 80 nA, the inductance of the inductors in the two transmon qubits is 300 pH, the critical current of the junctions in the plurality of compound Josephson junctions 232-235 is 12000 nA, and the inductance of the inductors 222-226 in the circuit path is 40 pH. In FIG. 4, a lowest frequency coupler mode for the tunable coupler, represented in gigahertz on a vertical axis 402, is plotted as a function of an applied flux, represented in fractions of the magnetic flux quantum on a horizontal axis 404.

As can be seen from the plotted line 406, the coupler mode frequency both starts and remains significantly higher than the low critical current implementation of FIG. 3. When the coupler mode is at the 88 GHz maximum, the coupling between the two components is minimal, at approximately 0.01 MHz, and the coupling remains low over the control flux range 0-0.15 $\Phi_0$. At the coupler mode frequency maximum, at zero control flux, the coupler frequency exhibits a slope of $2 \times 10^{-7}$ MHz/m$\Phi_0$, such that the variance of the frequency with the control flux has a minimal effect on the coupling. With standard couplers, the "off" flux of a given coupler can depend on flux applied to another coupler coupling the same quantum object, and the insensitivity to extraneous flux in this implementation provides a significant advantage. When the control flux approaches 0.5 $\Phi_0$, the frequency of the coupler mode dips sharply toward the 10 GHz characteristic frequency of the qubits 202 and 204, although the minimum value is on the order of 20 GHz. At this value, the coupler 210 provides a coupling of around 100 MHz, with a slope of around 14.8 MHz/m$\Phi_0$.

The benefit of designing a coupler with a small coupler capacitance limit, as shown in FIG. 4, is that the coupler frequencies can remain well above the qubit frequencies over the full range of tuning flux. This limit can be reached, for example, by utilizing small area junctions with high plasma frequencies. In this regime, the coupler in the "off" state can be described as a repeated current divider with the amount of qubit induced current decreasing in each successive leg by a factor of approximately $\sqrt{L_L/2L_B \cos\Phi/\Phi_0}$, where $L_L$ is the inductance at each of the Josephson junctions in the compound Josephson junctions 232-235 and $L_B$ is an inductance of each of the plurality of inductors 222-226 in the circuit path 220, and Φ is the applied flux. The current-current coupling between the qubits is thus exponentially suppressed in the length of the coupler. Alternatively, the maximum "on" coupling is achieved when the flux applied to each of the plurality of compound Josephson junctions 232-235 is tuned to 0.5 $\Phi_0$, with the maximum coupling being approximately equal to a product of a maximum mutual inductance between the qubits, $M_{max}$, and a square of the qubit currents, and $M_{max} \approx L_E^2/(2L_E+(N_L+1)L_B)$, $L_E$ is the inductance at the two qubits 202 and 204, and $N_L$ is the number of compound Josephson junctions.

Figure 5:
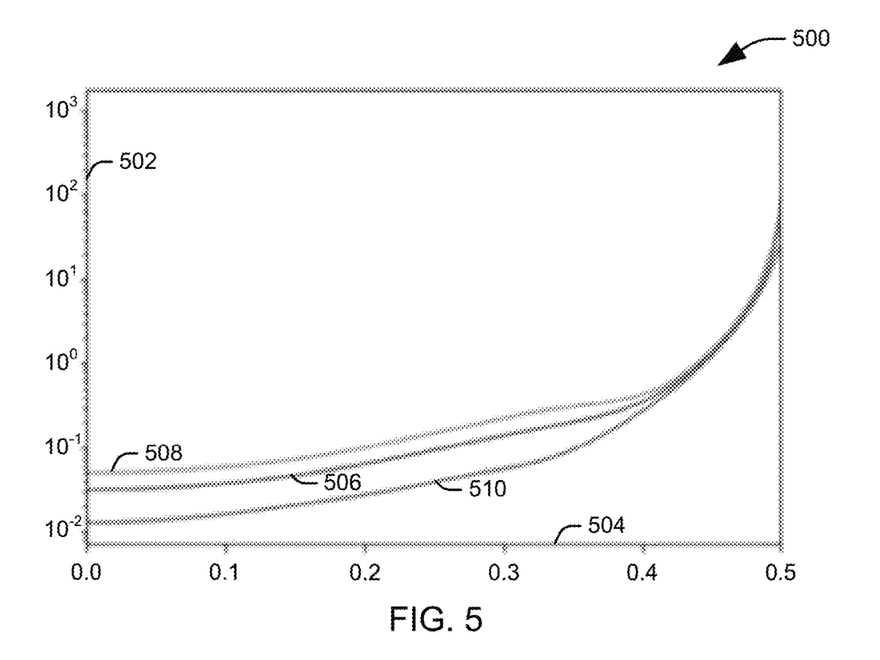
FIG. 5 is a chart illustrating a variance of a turn-off behavior of the tunable coupler of FIG. 2 with variation in the critical currents of the Josephson junctions comprising the compound Josephson junctions.

FIG. 5 is a chart 500 illustrating a variance of a turn-off behavior of the tunable coupler of FIG. 2 with variation in the critical currents of the Josephson junctions comprising the compound Josephson junctions. In the chart, a coupling strength of the coupler is represented logarithmically in MHz on the vertical axis 502, and the control flux provided to the compound Josephson junctions is represented in fractions of the magnetic flux quantum on the horizontal axis 504. It will be appreciated that the fabrication of Josephson junctions is not always exact, and that a degree of variation will be present in the critical current of a given junction. To represent this, the chart 500 includes a first curve 506, representing a mean value for coupling given a 10% variation in critical currents for each junction, a second curve 508, representing a value for the coupling one standard deviation above the mean given a 10% variation in critical currents for each junction, and a third curve 510, representing a value for the coupling one standard deviation below the mean given a 10% variation in critical currents for each junction. As can be seen from the plots, the degree of residual coupling varies slightly with the junction fabrication, but there is little change in the relatively large range of values for which the coupling remains minimal.

Figure 6:
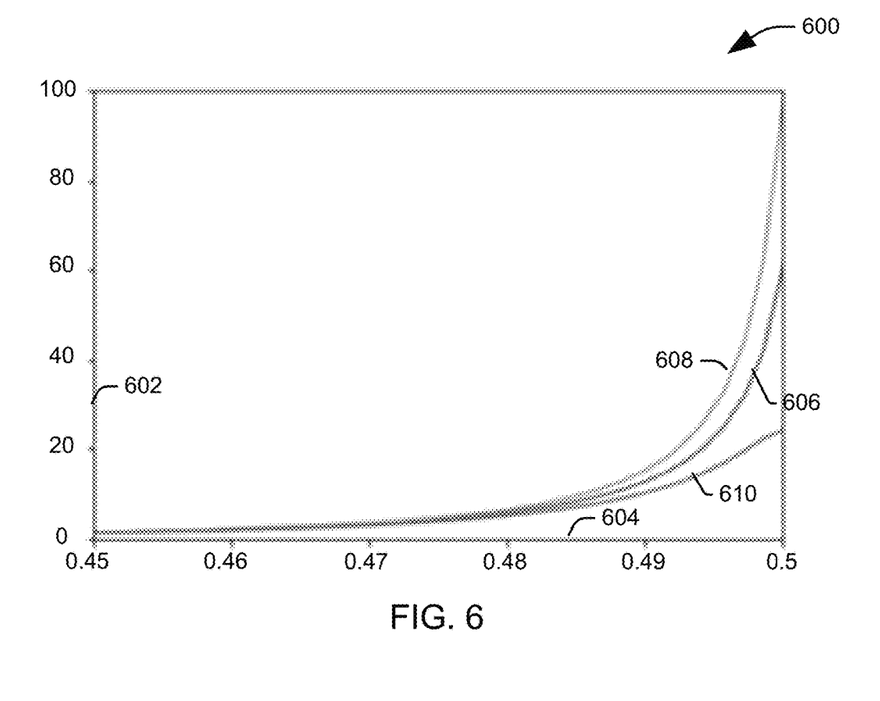
FIG. 6 is a chart illustrating a variance of a turn-on behavior of the tunable coupler of FIG. 2 with variation in the critical currents of the Josephson junctions comprising the compound Josephson junctions.

FIG. 6 is a chart 600 illustrating a variance of a turn-on behavior of the tunable coupler of FIG. 2 with variation in the critical currents of the Josephson junctions comprising the compound Josephson junctions. In the chart, a coupling strength of the coupler is represented in MHz on the vertical axis 602, and the control flux provided to the compound Josephson junctions is represented in fractions of the magnetic flux quantum on the horizontal axis 604. The chart 600 includes a first curve 606, representing the mean value for the coupling given a 10% variation in critical currents for each junction, a second curve 608, representing a value for the coupling one standard deviation above the mean given a 10% variation in critical currents for each junction, and a third curve 610, representing a value for the coupling one standard deviation below the mean given a 10% variation in critical currents for each junction. As can be seen from the plots, the turn-on behavior does exhibit variation with variations in the critical currents of the Josephson junctions, although it simply changes the setpoint for the on-coupling.

Figure 7:
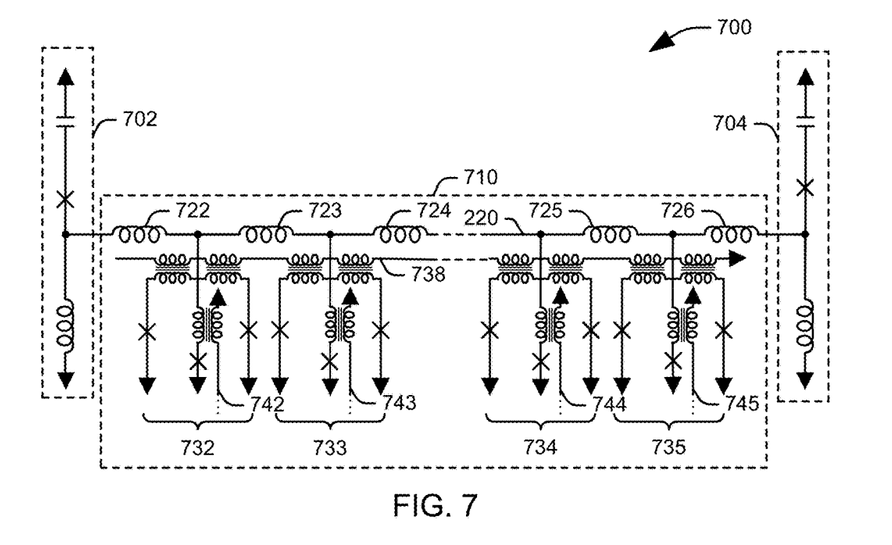
FIG. 7 illustrates another example of a superconducting system comprising two transmon qubits and a tunable coupler.

To allow for tuning for the set point for the on-coupling, for example, due to fabrication variations, FIG. 7 illustrates another example of a superconducting system 700 comprising two transmon qubits 702 and 704 and a tunable coupler 710. The tunable coupler 710 includes a circuit path 720, comprising a plurality of inductors 722-726, and a plurality of compound Josephson junctions 732-735 connected from the circuit path 720 to ground. In the illustrated implementation, each compound Josephson junction comprises three paths to ground, each interrupted by a Josephson junction. Two of the three paths are inductively coupled to a common current bias line 738 to provide a control flux to the compound Josephson junctions. The bias line 738 controls the state of the coupler in a manner similar to that described for FIG. 2.

The third path of each compound Josephson junction 732-735 is tunable by using a combination of respective direct current (DC) bias lines 742-745 to tune, within limits, a setpoint for the on-coupling of the tunable coupler. It will be appreciated that individual addressability of these bias lines is not necessary to the function of the device, and that they may be set by one or more common control lines. The DC bias allows the setpoint to be adjusted for errors in fabrication of the Josephson junctions, and allows for an on state that is relatively insensitive to minor variations in the control flux. This significantly relaxes constraints on flux pulses for controlling the coupler and reduces dephasing of the coupled components.

Figure 8:
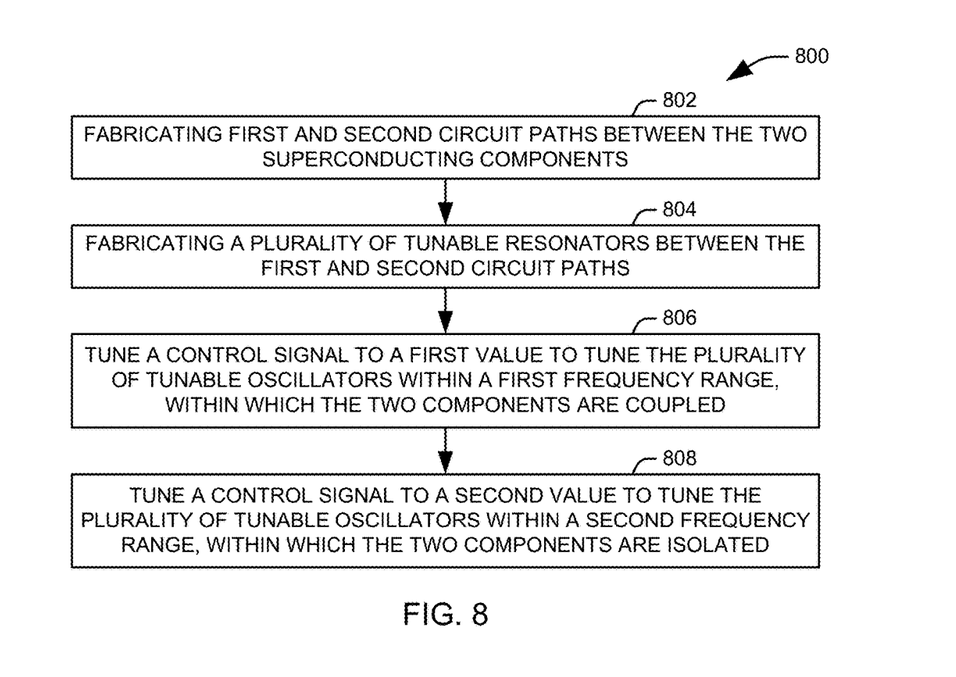
FIG. 8 illustrates a method for coupling two superconducting circuit components.

FIG. 8 illustrates a method 800 for coupling two superconducting circuit components. At 802, first and second circuit paths are fabricated between the two superconducting components. The first circuit path comprises a plurality of circuit elements, which can include any of inductors, capacitors, and Josephson junction. The second circuit path can include one or more circuit elements or may be a common ground. At 804, a plurality of tunable oscillators are fabricated forming connections between the first and second circuit paths. For example, the tunable oscillators can be fabricated as a plurality of compound Josephson junctions connecting the first circuit path to the second circuit path. Each tunable oscillator is designed to be responsive to a control signal to tune an associated frequency of the oscillator. In one implementation, a common bias line can be fabricated to be inductively coupled to each of plurality of tunable oscillators, such that the control signal can be provided via the common bias line.

At 806, the control signal can be provided at a value within a predefined range to tune the plurality of tunable oscillators within a first frequency range, within which the two components are coupled. In one implementation, the control signal is provided as a control flux to each of the plurality of tunable oscillators. At 808, the control signal is provided at a value outside of the predefined range to tune the plurality of tunable oscillators within a second frequency range, within which the two components are isolated. In one implementation, the predefined range does not include the value zero, such that the two components are isolated when no control signal is present.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A tunable coupler assembly for linking two components in a superconducting circuit, comprising:
   a plurality of circuit elements, each comprising one of an inductor, a capacitor, and a Josephson junction, connected in series on a path connecting the two components; and
   a plurality of tunable oscillators, connected to the path connecting the two components, each tunable oscillator being responsive to a control signal to tune an associated resonance frequency of the tunable oscillator within a first frequency range, within which the two components are coupled, and within a second frequency range, within which the two components are isolated.

2. The tunable coupler assembly of claim 1, wherein each of the plurality of tunable oscillators connect the circuit path to ground.

3. The tunable coupler assembly of claim 1, wherein the control signal is provided to each of the plurality of tunable oscillators via a current provided on a common bias line.

4. The tunable coupler assembly of claim 1, wherein each of the plurality of tunable couplers are implemented as compound Josephson junctions.

5. The tunable coupler assembly of claim 4, wherein each of the plurality of tunable couplers are implemented with three Josephson junctions connected in parallel.

6. The tunable coupler assembly of claim 5, wherein the control signal is a first control signal that is provided to paths containing first and second Josephson junctions of the three Josephson junctions, and a second control signal is provided to a path containing a third Josephson junction of the three Josephson junctions.

7. The tunable coupler assembly of claim 6, wherein the first control signal is provided as a current signal on a first bias line, inductively coupled to each of the paths containing first and second Josephson junctions of the three Josephson junctions for each of the plurality of tunable couplers, and the second control signal is provided as a current signal on a second bias line inductively coupled to each path containing a third Josephson junction of the three Josephson junctions for each of the plurality of tunable couplers.

8. The tunable coupler assembly of claim 1, wherein the tunable coupler assembly provides a coupling strength less than one hundred kilohertz between the two components when the control signal is absent, and provides a coupling strength greater than fifty megahertz when the control signal is tuned to a first value.

9. The tunable coupler assembly of claim 1, wherein the control signal is an electrical current that produces an applied flux, and the coupler is configured to provide a maximum coupling when a magnitude of the applied flux of around one-half of a magnetic flux quantum, and a coupling substantially less than the maximum coupling when the magnitude of the applied flux is one of less than 0.45 of the magnetic flux quantum.

10. The tunable coupler assembly of claim 1, wherein each of the plurality of circuit elements is an inductor having an inductance between ten and five hundred picohenries.

11. The tunable coupler assembly of claim 1, wherein each of the plurality of tunable oscillators are responsive to the control signal to assume a frequency between five gigahertz and forty gigahertz.

12. A method for providing a tunable coupling between two components in a superconducting circuit, comprising:
fabricating a first circuit path between the two components, the first circuit path comprising a plurality of circuit elements, each of the plurality of circuit elements comprising one of an inductor, a capacitor, and a Josephson junction; and
fabricating a plurality of tunable oscillators, each responsive to a control signal to tune an associated frequency of the oscillator and connected from a point along the first circuit path.

13. The method of claim 12, wherein fabricating the plurality of tunable oscillators comprises fabricating a plurality of compound Josephson junctions connecting the circuit path to a second circuit path between the two components.

14. The method of claim 12, wherein the second circuit path is a common ground.

15. The method of claim 14, further comprising:
providing the control signal at a value within a predefined range to tune the plurality of tunable oscillators within a first frequency range, within which the two components are coupled; and
providing the control signal at a value outside of the predefined range to tune the plurality of tunable oscillators within a second frequency range, within which the two components are isolated.

16. The method of claim 15, wherein the predefined range does not include the value zero, such that the two components are isolated when no control signal is present.

17. The method of claim 15, wherein providing the control signal comprises providing a control flux to each of the plurality of tunable oscillators.

18. The method of claim 12, wherein the plurality of circuit elements is a first plurality of circuit elements, and the second circuit path comprises a second plurality of circuit elements, each of the plurality of circuit elements comprising one of an inductor, a capacitor, and a Josephson junction.

19. The method of claim 12, further comprising fabricating a common bias line that is inductively coupled to each of plurality of tunable oscillators, such that the control signal can be provided via the common bias line.

20. A tunable coupler assembly for linking two components in a superconducting circuit, comprising:
a plurality of circuit elements, connected in series on a path connecting the two components each of the plurality of circuit elements comprising one of an inductor, a capacitor, and a Josephson junction; and
a plurality of compound Josephson junctions, connected from the path connecting the two components to ground, each tunable oscillator being responsive to a control flux provided by a common bias line to tune an associated resonant frequency of the tunable oscillator within a first frequency range, within which the two components are coupled, and within a second frequency range, within which the two components are isolated.

* * * * *